United States Patent
Mimura

(10) Patent No.: US 10,797,680 B2
(45) Date of Patent: Oct. 6, 2020

(54) ELASTIC WAVE DEVICE, HIGH-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 54 days.

(21) Appl. No.: 16/177,542

(22) Filed: Nov. 1, 2018

(65) Prior Publication Data
US 2019/0165763 A1 May 30, 2019

(30) Foreign Application Priority Data
Nov. 29, 2017 (JP) .................................. 2017-229325

(51) Int. Cl.
| | | |
|---|---|---|
| *H03H 9/25* | (2006.01) | |
| *H03H 9/17* | (2006.01) | |
| *H03H 3/10* | (2006.01) | |
| *H03H 9/02* | (2006.01) | |
| *H03H 9/145* | (2006.01) | |
| *H03H 3/02* | (2006.01) | |
| *H01Q 3/26* | (2006.01) | |

(52) U.S. Cl.
CPC ............ *H03H 9/25* (2013.01); *H01Q 3/2688* (2013.01); *H03H 3/02* (2013.01); *H03H 3/10* (2013.01); *H03H 9/02228* (2013.01); *H03H 9/02574* (2013.01); *H03H 9/02834* (2013.01); *H03H 9/02866* (2013.01); *H03H 9/14502* (2013.01); *H03H 9/14541* (2013.01); *H03H 9/175* (2013.01); *H03H 2003/025* (2013.01)

(58) Field of Classification Search
CPC .. H03H 9/25; H03H 9/02866; H03H 9/02834; H03H 9/02574; H03H 9/14541; H03H 3/02; H03H 9/175; H03H 9/14502; H03H 9/02228; H03H 3/10; H03H 2003/025; H01Q 3/2688
USPC ......................................... 333/133, 187, 188
See application file for complete search history.

(56) References Cited

U.S. PATENT DOCUMENTS

| | | | |
|---|---|---|---|
| 9,219,466 B2 * | 12/2015 | Meltaus ................. | H03H 9/564 |
| 2013/0147578 A1 * | 6/2013 | Hara ...................... | H03H 9/605 |
| | | | 333/133 |

(Continued)

FOREIGN PATENT DOCUMENTS

| | | |
|---|---|---|
| KR | 10-2014-0101773 A | 8/2014 |
| WO | 2012/086441 A1 | 6/2012 |
| WO | 2017/068827 A1 | 4/2017 |

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes a supporting substrate, an acoustic reflection layer disposed on the supporting substrate, a piezoelectric layer disposed on the acoustic reflection layer, and an interdigital transducer electrode disposed on the piezoelectric layer. The acoustic reflection layer includes three or more low acoustic impedance layers and two or more high acoustic impedance layers. A film thickness of the low acoustic impedance layer closest to the piezoelectric layer is larger than a film thickness of the low acoustic impedance layer closest to the low acoustic impedance layer that is closest to the piezoelectric layer.

20 Claims, 8 Drawing Sheets

(56) References Cited

U.S. PATENT DOCUMENTS

2014/0152146 A1 6/2014 Kimura et al.
2014/0312994 A1 10/2014 Meltaus et al.
2018/0205362 A1 7/2018 Kishimoto et al.

* cited by examiner

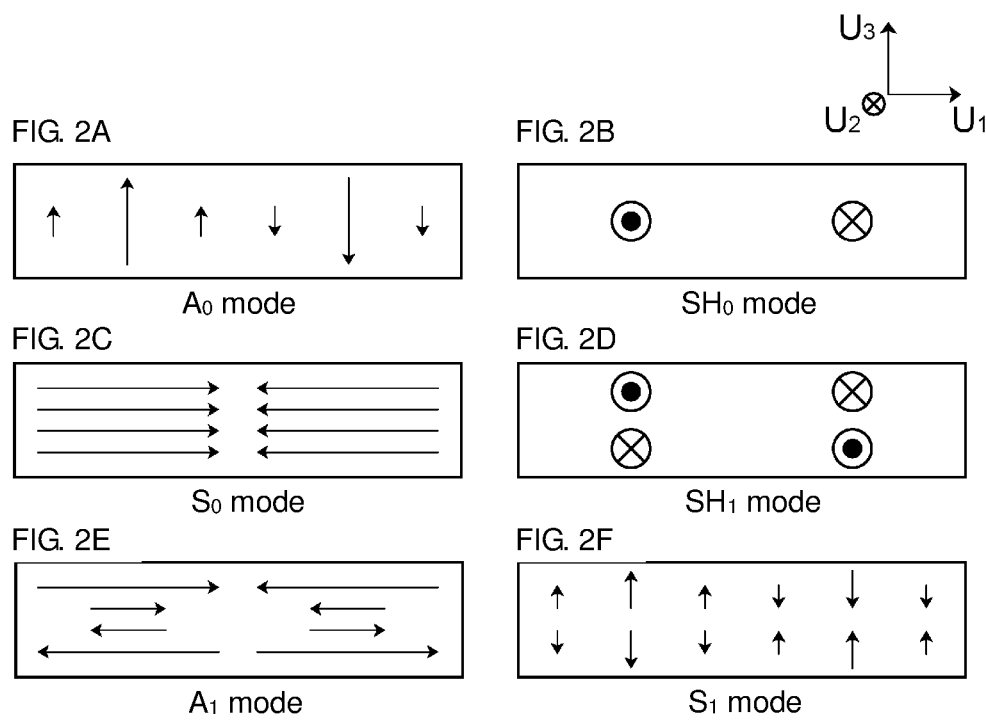
FIG. 2A  A₀ mode
FIG. 2B  SH₀ mode
FIG. 2C  S₀ mode
FIG. 2D  SH₁ mode
FIG. 2E  A₁ mode
FIG. 2F  S₁ mode
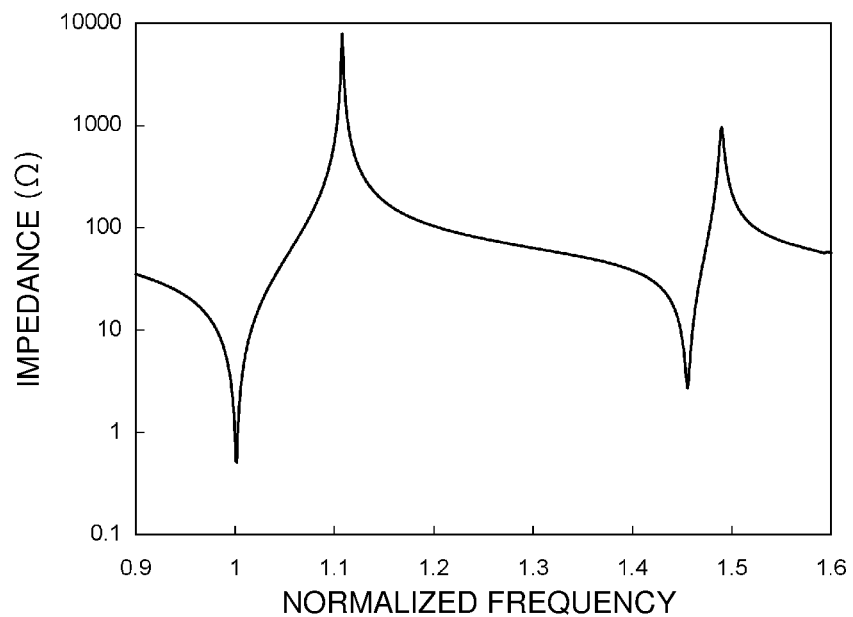
FIG. 3

POSITION IN PIEZOELECTRIC LAYER OF ELASTIC WAVE DEVICE IN THICKNESS DIRECTION

POSITION IN PIEZOELECTRIC LAYER OF ELASTIC WAVE DEVICE IN THICKNESS DIRECTION

ELASTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-229325 filed on Nov. 29, 2017. The entire contents of this application are hereby incorporated herein by reference.

BACKGROUND OF THE INVENTION

1. Field of the Invention

The present invention relates to an elastic wave device, a high-frequency front-end circuit, and a communication apparatus.

2. Description of the Related Art

Elastic wave devices have been widely used for filters and so forth of cellular phones. International Publication No. 2012/086441 discloses an example of an elastic wave device. The elastic wave device includes an acoustic reflection layer disposed between a supporting substrate and a piezoelectric layer. In the acoustic reflection layer, high acoustic impedance layers and low acoustic impedance layers are alternately stacked. The elastic wave device disclosed in International Publication No. 2012/086441 uses an $S_0$-mode plate wave as a fundamental mode. The low acoustic impedance layers have the same film thickness. The high acoustic impedance layers have the same film thickness.

In the elastic wave device disclosed in International Publication No. 2012/086441, a large spurious response tends to occur at higher frequencies than the fundamental mode. For example, in the case in which a device for Band 42, which is an about 3.5-GHz communication band, is produced, a spurious response occurs in an about 5-GHz frequency band for wireless LANs. This is sometimes problematic.

Furthermore, in the elastic wave device, the frequency-temperature characteristics cannot be sufficiently improved.

SUMMARY OF THE INVENTION

Preferred embodiments of the present invention provide elastic wave devices each including a spurious response frequency that is distant from frequency bands used for other communication systems and having effectively improved frequency-temperature characteristics, high-frequency front-end circuits, and communication apparatuses.

According to a preferred embodiment of the present invention, an elastic wave device includes a supporting substrate, an acoustic reflection layer disposed on the supporting substrate, a piezoelectric layer disposed on the acoustic reflection layer, and an interdigital transducer electrode disposed on the piezoelectric layer, in which the acoustic reflection layer includes three or more low acoustic impedance layers and two or more high acoustic impedance layers, wherein a film thickness of the low acoustic impedance layer closest to the piezoelectric layer is larger than a film thickness of the low acoustic impedance layer closest to the low acoustic impedance layer that is closest to the piezoelectric layer.

In an elastic wave device according to a preferred embodiment of the present invention, in at least the three or more low acoustic impedance layers and the two or more high acoustic impedance layers, the low acoustic impedance layers and the high acoustic impedance layers may be alternately stacked. In this case, the reflectance of the acoustic reflection layer is further improved to further reduce loss.

In an elastic wave device according to a preferred embodiment of the present invention, the film thickness of the low acoustic impedance layer closest to the piezoelectric layer may be about 1.38 times or less the film thickness of the low acoustic impedance layer closest to the low acoustic impedance layer that is closest to the piezoelectric layer. In this case, a spurious response frequency is even more distant from frequency bands used for other communication systems, thus further reducing or preventing the influence of the spurious response on other communication systems.

In an elastic wave device according to a preferred embodiment of the present invention, the film thickness of the low acoustic impedance layer closest to the piezoelectric layer may be in the range of about 0.7 times to about 0.8 times a component of the wavelength of a transversal elastic wave in the thickness direction of the piezoelectric layer, the transversal elastic wave propagating through the low acoustic impedance layer closest to the piezoelectric layer. In this case, the frequency-temperature characteristics are further improved without degrading the reflection characteristics of the acoustic reflection layer.

In an elastic wave device according to a preferred embodiment of the present invention, the film thickness of each of the low acoustic impedance layers except the low acoustic impedance layer closest to the piezoelectric layer may be in the range of about 0.2 times to about 0.3 times a component of the wavelength of a transversal elastic wave in the thickness direction of the piezoelectric layer, the transversal elastic wave propagating through the low acoustic impedance layers, and the film thickness of each of the high acoustic impedance layers may be in the range of about 0.2 times to about 0.3 times a component of the wavelength of a transversal elastic wave in the thickness direction of the piezoelectric layer, the transversal elastic wave propagating through the high acoustic impedance layers. In this case, the elastic wave is effectively confined to the piezoelectric layer side.

In an elastic wave device according to a preferred embodiment of the present invention, an $S_0$-mode plate wave may be used.

In an elastic wave device according to a preferred embodiment of the present invention, a spurious response of a different mode from a fundamental mode used may occur, in which denoting the resonant frequency of the spurious response as $F_s$, denoting the resonant frequency of the fundamental mode as $F_m$, and denoting the resonant frequency ratio of the spurious response to the fundamental mode as $F_s/F_m$, the resonant frequency ratio $F_s/F_m$ may be outside the range of about 1.45 to about 1.55. In this case, the influence of the spurious response on other communication systems is further reduced or prevented.

In an elastic wave device according to a preferred embodiment of the present invention, each of the low acoustic impedance layers may be made of silicon oxide.

According to a preferred embodiment of the present invention, a high-frequency front-end circuit includes the elastic wave device according to a preferred embodiment of the present invention and a power amplifier.

According to a preferred embodiment of the present invention, a communication apparatus includes the high-frequency front-end circuit according to a preferred embodiment of the present invention and an RF signal processing circuit.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2F illustrate examples of propagation modes of plate waves.

FIG. 3 illustrates the impedance characteristics of an elastic wave device according to a first comparative example.

DETAILED DESCRIPTION OF THE PREFERRED EMBODIMENTS

Preferred embodiments of the present invention will be described below with reference to the attached drawings so as to clarify the present invention.

Preferred embodiments described herein are illustrative. It should be noted that partial replacement and combination of configurations in different preferred embodiments may be made.

Figure 1A:
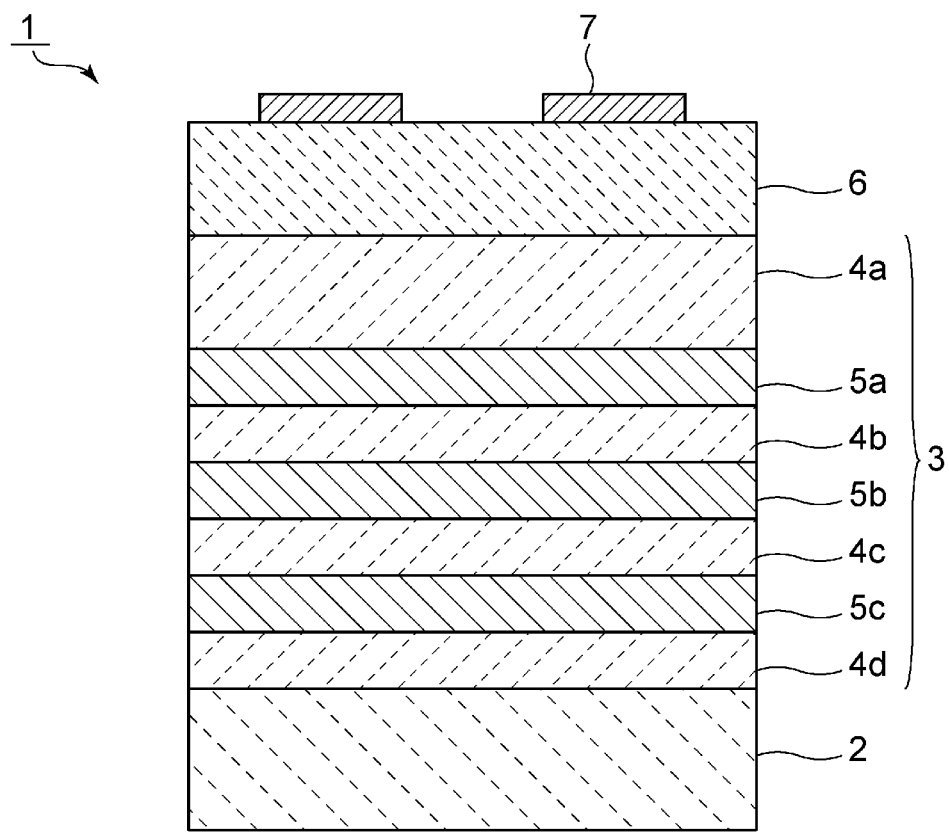
FIG. 1A is an elevational cross-sectional view of an elastic wave device according to a first preferred embodiment of the present invention.
Figure 1B:
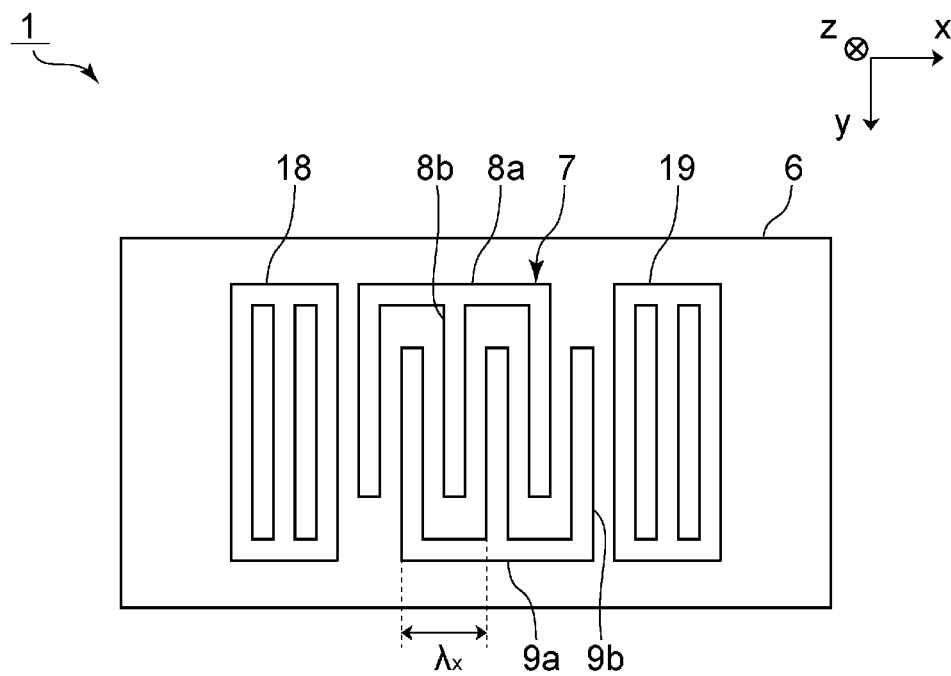
FIG. 1B is a schematic plan view of the electrode structure of the elastic wave device according to the first preferred embodiment of the present invention.

FIG. 1A is an elevational cross-sectional view of an elastic wave device according to a first preferred embodiment of the present invention. FIG. 1B is a schematic plan view of the electrode structure of the elastic wave device according to the first preferred embodiment.

An elastic wave device 1 includes a supporting substrate 2. The supporting substrate 2 is composed of silicon (Si) in the present preferred embodiment. The material of the supporting substrate 2 is not limited thereto. Examples thereof include glass, spinel, aluminum nitride, aluminum oxide, silicon carbide, silicon nitride, silicon oxynitride, diamond-like carbon (DLC), silicon, sapphire, piezoelectric materials such as lithium tantalate, lithium niobate, and quartz crystal, ceramic materials such as alumina, zirconia, cordierite, mullite, steatite, and forsterite, diamond, magnesia, a material mainly including any of the foregoing materials, and a material mainly including any of mixtures of the foregoing materials.

An acoustic reflection layer 3 is disposed on the supporting substrate 2. A piezoelectric layer 6 is disposed on the acoustic reflection layer 3. An interdigital transducer electrode 7 is disposed on the piezoelectric layer 6. The application of an alternating voltage to the interdigital transducer electrode 7 excites an elastic wave. The acoustic reflection layer 3 reflects an elastic wave toward the piezoelectric layer 6 and confines the elastic wave to the piezoelectric layer 6 side.

An intermediate layer preferably made of, for example, titanium or nickel may be disposed between the piezoelectric layer 6 and the acoustic reflection layer 3. An intermediate layer preferably made of, for example, titanium or nickel may be disposed between the acoustic reflection layer 3 and the supporting substrate 2. The interdigital transducer electrode 7 may preferably be indirectly disposed on the piezoelectric layer 6 with, for example, a silicon oxide film interposed therebetween.

The acoustic reflection layer 3 includes low acoustic impedance layers having relatively low acoustic impedances and high acoustic impedance layers having relatively high acoustic impedances. In the present preferred embodiment, the acoustic reflection layer 3 is a stacked film in which the low acoustic impedance layers and the high acoustic impedance layers are alternately stacked.

An intermediate layer may be disposed between each of the low acoustic impedance layers and a corresponding one of the high acoustic impedance layers.

The acoustic reflection layer 3 of the elastic wave device 1 preferably includes, as the low acoustic impedance layers, for example, four low acoustic impedance layers 4a, 4b, 4c, and 4d. The acoustic reflection layer 3 preferably includes, as the high acoustic impedance layers, for example, three high acoustic impedance layers 5a, 5b, and 5c.

The low acoustic impedance layers 4a, 4b, 4c, and 4d in the present preferred embodiment are preferably made of silicon oxide, for example. Silicon oxide is denoted by $SiO_x$ (where x is a real number). While the value of x is not particularly limited, each of the low acoustic impedance layers in the present preferred embodiment is preferably made of SiO$_2$, for example. The material of the low acoustic impedance layers is not limited thereto. Any material having relatively low acoustic impedance may be used.

The high acoustic impedance layers 5a, 5b, and 5c are preferably made of Pt, for example. The material of the high acoustic impedance layers is not limited thereto and may be, for example, a metal such as W or a dielectric such as aluminum nitride, silicon nitride, tantalum oxide, or hafnium oxide. Any material having relatively high acoustic impedance may be used as the material of the high acoustic impedance layers.

Among the low acoustic impedance layers in the acoustic reflection layer 3, the closest layer to the piezoelectric layer 6 is the low acoustic impedance layer 4a. Among the high acoustic impedance layers, the closest layer to the piezoelectric layer 6 is the high acoustic impedance layer 5a. In the acoustic reflection layer 3 in the present preferred embodiment, while the closest layer to the piezoelectric layer 6 is the low acoustic impedance layer, the closest layer to the piezoelectric layer 6 may be the high acoustic impedance layer.

Here, the acoustic reflection layer 3 may preferably include at least three low acoustic impedance layers and at least two high acoustic impedance layers, for example. In this case, because the total number of layers of the low acoustic impedance layers and the high acoustic impedance layers in the acoustic reflection layer 3 is five or more, an elastic wave is effectively confined to the piezoelectric layer 6 side. Accordingly, the reflectance of the acoustic reflection layer 3 is improved to reduce loss.

In the case in which the five acoustic impedance layers including the three low acoustic impedance layers and the two high acoustic impedance layers are arranged such that the low acoustic impedance layers and the high acoustic impedance layers are alternately stacked, the reflectance of the acoustic reflection layer 3 is further improved to further reduce the loss.

The film thickness of the low acoustic impedance layer 4a is larger than those of the other low acoustic impedance layers 4b, 4c, and 4d. The low acoustic impedance layers 4b, 4c, and 4d have the same or substantially the same film thickness. The high acoustic impedance layers 5a, 5b, and 5c in the present preferred embodiment have the same or substantially the same film thickness. Here, the phrase "the same film thickness" used in this specification indicates that the layers have substantially the same film thickness to the extent that the filter characteristics of the elastic wave device are not impaired. Each of the low acoustic impedance layers need not be a single layer and may have a stacked structure including layers made of a material having relatively low acoustic impedance. Each low acoustic impedance layer may also have a stacked structure including an intermediate layer interposed between the layers, the intermediate layer preferably being made of, for example, titanium or nickel. In this case, the film thickness of each low acoustic impedance layer refers to the film thickness of the entire stacked structure thereof. Similarly, each of the high acoustic impedance layers need not be a single layer and may have a stacked structure including layers made of a material having relatively high acoustic impedance. Each high acoustic impedance layer may also have a stacked structure including an intermediate layer interposed between the layers, the intermediate layer preferably being made of, for example, titanium or nickel. In this case, the film thickness of each high acoustic impedance layer refers to the film thickness of the entire stacked structure thereof.

The film thickness of each of the low acoustic impedance layers and the film thickness of each of the high acoustic impedance layers are set so as to improve the reflectance of an elastic wave in a frequency band in which a mode used as a fundamental mode in the elastic wave device 1 is excited and so as to sufficiently reduce the leakage of the elastic wave to the supporting substrate 2. The elastic wave excited in the piezoelectric layer 6 is reflected from boundary surfaces of the layers in the acoustic reflection layer 3. Thus, regarding the energy of the elastic wave present in each of the layers in the acoustic reflection layer 3, the elastic wave present in a closer layer to the piezoelectric layer 6 has higher energy.

The piezoelectric layer 6 in the present preferred embodiment is preferably made of, for example, lithium niobate (LiNbO$_3$). The piezoelectric layer 6 may be made of, for example, a piezoelectric single crystal, such as lithium tantalate, or an appropriate piezoelectric ceramic material, such as zinc oxide (ZnO), aluminum nitride (AlN), quartz crystal (SiO$_2$), or PZT, in place of lithium niobate.

The material of the interdigital transducer electrode 7 in the present preferred embodiment is preferably, but not limited to, Al, for example. The interdigital transducer electrode 7 may include a single-layer metal film or a stacked metal film in which metal layers are stacked.

As illustrated in FIG. 1B, reflectors 18 and 19 are disposed on respective sides of the interdigital transducer electrode 7 on the piezoelectric layer 6 in an elastic wave propagation direction. The interdigital transducer electrode 7 includes a first busbar 8a and a second busbar 9a, the first busbar 8a and the second busbar 9a facing each other. The interdigital transducer electrode 7 includes first electrode fingers 8b each including an end connected to the first busbar 8a. The interdigital transducer electrode 7 includes second electrode fingers 9b each including an end connected to the second busbar 9a. The first electrode fingers 8b and the second electrode fingers 9b are interdigitated with each other.

In the present application, an xyz coordinate system is defined as illustrated in FIG. 1B. Specifically, an x-direction is perpendicular or substantially perpendicular to the first electrode fingers 8b and the second electrode fingers 9b of the interdigital transducer electrode 7 and is the elastic wave propagation direction. A y-direction is parallel or substantially parallel to the first electrode fingers 8b and the second electrode fingers 9b and is an intersecting width direction. A z-direction is the thickness direction of the piezoelectric layer 6.

The application of an alternating voltage to the interdigital transducer electrode 7 excites an elastic wave. The wavelength of the elastic wave excited in the propagation direction, i.e., the wavelength in the x-direction, is denoted by $\lambda_x$ indicated in FIG. 1B and defined by the electrode finger pitch of the interdigital transducer electrode.

The mode of an elastic wave used is not particularly limited. The elastic wave device 1 preferably uses, for example, an S$_0$-mode plate wave as a fundamental mode. The term "plate wave" is a generic term used to refer to various waves excited in the piezoelectric layer having a normalized film thickness of about 1$\lambda_x$ or less, where $\lambda_x$ indicates the wavelength of an elastic wave excited in the propagation direction, and the normalized film thickness is obtained by normalizing a film thickness to wavelength $\lambda_x$. Any method for concentrating the wave may be used as long as the wave is concentrated on the piezoelectric layer. Specifically, a membrane structure in which cavities are provided above and below a piezoelectric layer and a wave is confined only in the piezoelectric layer may be used. Alternatively, a structure in which a component to reflect an elastic wave, for example, an acoustic reflection layer, is disposed on at least one of upper and lower surfaces of a piezoelectric layer may be used. Preferred embodiments of the present application provide structures that confine a plate wave in the piezoelectric layer with an acoustic reflection layer.

The piezoelectric layer 6 of the elastic wave device 1 is preferably made of LiNbO$_3$, for example. Thus, the S$_0$-mode plate wave is excited at an acoustic velocity of about 5,000 m/s to about 7,000 m/s, for example. The acoustic velocity used here is defined by the product of a frequency at which an elastic wave is excited and the wavelength of the elastic wave. The phrase "frequency at which the elastic wave is excited" refers to the operating frequency of the elastic wave device. The phrase "wavelength of the elastic wave" refers to a length defined by the period of the interdigital transducer electrode 7 on a surface of the piezoelectric layer 6 of the elastic wave device. In the case in which the period of the electrode fingers is changed in one interdigital transducer electrode, the average of the period in the interdigital transducer electrode is defined as the wavelength of the elastic wave excited by the interdigital transducer electrode. In the case in which the piezoelectric layer 6 of the elastic wave device 1 is made of LiNbO$_3$ and the product, which is determined as above, of the frequency at which the elastic wave is excited and the wavelength of the elastic wave is about 5,000 m/s to about 7,000 m/s, it is recognized that the S$_0$-mode plate wave is used in the elastic wave device 1.

In the case in which the piezoelectric layer is made of LiTaO$_3$, the S$_0$ mode is excited at an acoustic velocity of about 5,000 m/s to about 7,000 m/s. In the case in which the piezoelectric layer is made of AlN, the S$_0$ mode is excited at an acoustic velocity of about 7,000 m/s to about 10,000 m/s. Accordingly, also in the case in which the piezoelectric layer is made of LiTaO$_3$ or AlN, when the acoustic velocity determined by the method as described above is within the above range, it is recognized that the S$_0$ mode is used.

FIGS. 2A to 2F illustrate examples of propagation modes of plate waves.

FIGS. 2A to 2F illustrate the directions of displacement of various propagation modes of plate waves. Directions $U_1$, $U_2$, and $U_3$ define a coordinate system. In the directions $U_1$ and $U_3$, directions of arrows are positive. In the direction $U_2$, the depth direction of the paper plane is positive. The direction $U_1$ indicates the propagation direction of the plate wave. The $U_2$ direction is parallel or substantially parallel to a main surface of the piezoelectric layer and perpendicular or substantially perpendicular to the propagation direction of the plate wave. That is, the direction $U_2$ is an SH-direction. The direction $U_3$ is the thickness direction of the piezoelectric layer. The directions $U_1$, $U_2$, and $U_3$ correspond to x-, y-, and z-directions, respectively, of the coordinate system illustrated in FIG. 1B.

As illustrated in FIGS. 2A to 2F, A$_0$-, SH$_0$-, and S$_0$-mode plate waves are generic terms used to refer to waves whose main displacement components are in directions $U_3$, $U_2$, and $U_1$, respectively, and which have no node in the thickness direction of the piezoelectric layer. Among modes that have no node in the thickness direction of the piezoelectric layer, generally, the frequency is increased in order of the A$_0$ mode, the SH$_0$ mode, and the S$_0$ mode. As illustrated in FIGS. 2A to 2F, SH$_1$-, A$_1$-, and S$_1$-mode plate waves are modes each including one node in the thickness direction of the piezoelectric layer. These modes generally have higher frequencies than modes, such as the S$_0$ mode, that have no node in the thickness direction of the piezoelectric layer.

In the present preferred embodiment, the elastic wave device includes the supporting substrate, the acoustic reflection layer disposed on the supporting substrate, the piezoelectric layer disposed on the acoustic reflection layer, and the interdigital transducer electrode disposed on the piezoelectric layer, the acoustic reflection layer includes three or more low acoustic impedance layers and two or more high acoustic impedance layers, and the film thickness of the low acoustic impedance layer 4a closest to the piezoelectric layer 6 is larger than that of the low acoustic impedance layer 4b closest to the low acoustic impedance layer 4a. Thus, the elastic wave device has a spurious response frequency that is distant from frequency bands used for other communication systems and has effectively improved frequency-temperature characteristics. This will be described below.

An elastic wave device having a structure according to the present preferred embodiment and an elastic wave device according to a first comparative example were produced, and the impedance characteristics were compared. The elastic wave device according to the first comparative example was different from the elastic wave device according to the present preferred embodiment in that the low acoustic impedance layers had the same film thickness. The specifications of the elastic wave device having the structure according to a first experimental example of the present preferred embodiment are described below. The reference numerals in FIGS. 1A and 1B are used below.

Piezoelectric layer 6: material: LiNbO$_3$, film thickness: about 340 nm, Euler angles: about (90°, 90°, 40°)

Interdigital transducer electrode 7: material: Al, film thickness: about 85 nm, duty ratio: about 0.5

Wavelength $\lambda_x$ of elastic wave in propagation direction, defined by electrode finger pitch of interdigital transducer electrode 7: about 1.7 μm Low acoustic impedance layers 4a to 4d: material: SiO$_2$, number of layers: 4

Film thickness of low acoustic impedance layer 4a: about 340 nm

Film thickness of each of low acoustic impedance layers 4b to 4d: about 272 nm

High acoustic impedance layers 5a to 5c: material: Pt, number of layers: 3

Film thickness of each of high acoustic impedance layers 5a to 5c: about 105 nm

Supporting substrate 2: material: Si

The specifications of the elastic wave device according to the first comparative example are described below.

Piezoelectric layer: material: LiNbO$_3$, film thickness: about 340 nm, Euler angles: about (90°, 90°, 40°)

Interdigital transducer electrode: material: Al, film thickness: about 85 nm, duty ratio: about 0.5

Wavelength $\lambda_x$ of elastic wave in propagation direction, defined by electrode finger pitch of interdigital transducer electrode: about 1.7 μm Low acoustic impedance layer: material: SiO$_2$, number of layers: 4

Film thickness of each of low acoustic impedance layers: about 272 nm

High acoustic impedance layer: material: Pt, number of layers: 3

Film thickness of each of high acoustic impedance layers: about 105 nm

Supporting substrate: material: Si

In the first comparative example, the film thicknesses of the low acoustic impedance layers and the high acoustic impedance layers are set such that the reflectance of the elastic wave is sufficiently high in a frequency band in which the $S_0$-mode plate wave used as a fundamental mode is excited. In the first experimental example, the low acoustic impedance layers except for the low acoustic impedance layer $4a$ and all of the high acoustic impedance layers have the same or substantially the same film thickness as in the first comparative example. The low acoustic impedance layer $4a$ has a larger thickness than other low acoustic impedance layers.

FIG. 3 illustrates the impedance characteristics of the elastic wave device according to the first comparative example. The horizontal axis in FIG. 3 indicates a normalized frequency obtained by normalizing frequency to the resonant frequency of the $S_0$-mode plate wave serving as a fundamental mode.

In the first comparative example, minimum and maximum impedance points occur at a normalized frequency of about 1.5, which indicates that a large spurious response occurs. The spurious response is problematic to other communication systems. To reduce or prevent the influence on other communication systems, ideally, no spurious response occurs. However, if this is difficult to achieve, a spurious response frequency needs to be adjusted to a frequency at which the system is operated without fault.

Here, in the elastic wave devices according to the first experimental example and the first comparative example, the phase velocity of the $S_0$-mode plate wave used is about 6,000 m/s, which is higher than the phase velocity of a common surface acoustic wave. The phase velocity of the common surface acoustic wave is about 3,500 m/s to about 4,000 m/s. Elastic wave devices using $S_0$-mode plate waves are preferably used for high-frequency devices in which elastic wave devices using common surface acoustic waves are not easily used.

For example, the elastic wave device according to the first comparative example is used for a high-frequency device, used for Band 42, having a pass band of about 3,400 MHz to about 3,600 MHz and that the resonant frequency of the fundamental mode is about 3,500 MHz. In this case, a large spurious response occurs at about 5,090 MHz. This may affect a 5-GHz wireless LAN band ranging from about 5,150 MHz to about 5,350 MHz. Thus, the spurious response frequency is preferably distant from this frequency band. Here, the frequency ratio of the wireless LAN band to Band 42 is in the range of about 1.45 to about 1.55. Thus, preferably, no spurious response occurs in the range of about 1.45 times to about 1.55 times the resonant frequency of the $S_0$-mode plate wave defining a fundamental mode. Accordingly, denoting the resonant frequency of the spurious response as $F_s$, denoting the resonant frequency of the fundamental mode as $F_m$, and denoting the resonant frequency ratio of the spurious response to the fundamental mode as $F_s/F_m$, the resonant frequency ratio $F_s/F_m$ is preferably outside the range of about 1.45 to about 1.55, for example.

Figure 4:
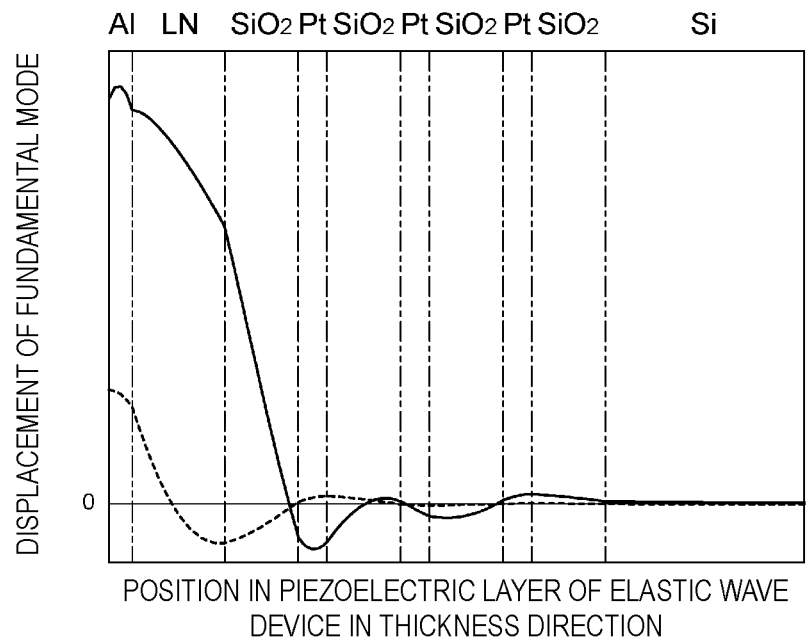
FIG. 4 illustrates a displacement distribution in the thickness direction of a piezoelectric layer at the frequency of a fundamental mode in the first comparative example.
Figure 5:
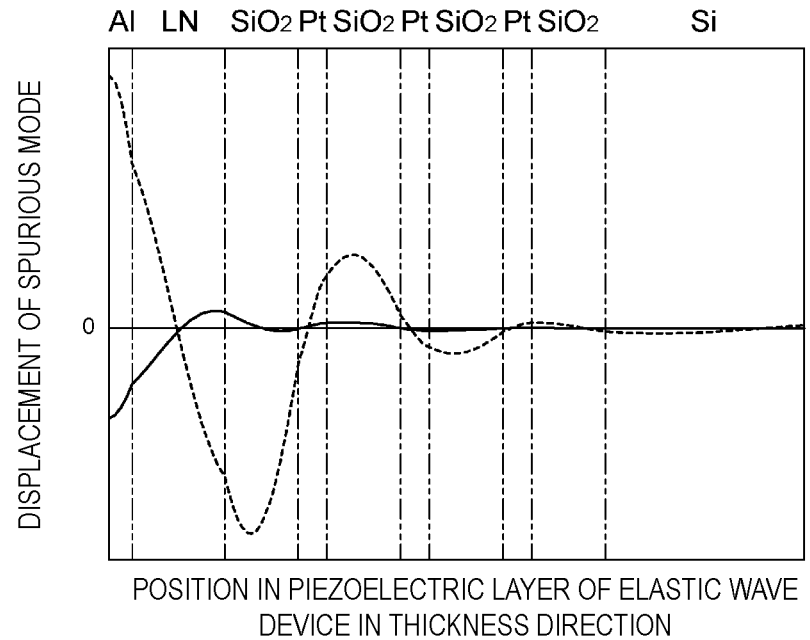
FIG. 5 illustrates a displacement distribution in the thickness direction of the piezoelectric layer at a spurious response frequency in the first comparative example.

FIGS. 4 and 5 illustrate displacement distributions in the thickness direction of the piezoelectric layer at the frequency of the fundamental mode and the spurious response frequency.

FIG. 4 illustrates the displacement distribution in the thickness direction of the piezoelectric layer at the frequency of the fundamental mode in the first comparative example. FIG. 5 illustrates the displacement distribution in the thickness direction of the piezoelectric layer at the spurious response frequency in the first comparative example. In FIG. 4, a solid line indicates a component in the direction $U_1$, and a broken line indicates a component in the direction $U_2$. A component in the direction $U_3$ is zero or substantially zero and thus is omitted in FIG. 4. A double-dotted chain line indicates boundaries of the layers in the elastic wave device. Characters located at an upper portion in FIG. 4 indicate the layers of the elastic wave device according to the first comparative example. Specifically, "Al" indicates the interdigital transducer electrode. "LN" indicates the piezoelectric layer. "$SiO_2$" indicates each low acoustic impedance layer. "Pt" indicates each high acoustic impedance layer. "Si" indicates the supporting substrate. The same is true in FIG. 5.

As illustrated in FIG. 4, the fundamental mode mainly includes a component in the direction $U_1$ and does not include a node, at which the displacement is zero or substantially zero in the piezoelectric layer. Thus, the fundamental mode corresponds to the $S_0$-mode plate wave illustrated in FIG. 2C. As illustrated in FIG. 5, the spurious mode mainly includes a component in the direction $U_2$ and includes one node in the piezoelectric layer. Thus, the spurious mode corresponds to a $SH_1$-mode plate wave illustrated in FIG. 2D. In the first preferred embodiment, similarly, the fundamental mode corresponds to the $S_0$ mode, and the spurious mode corresponds to the $SH_1$ mode.

Figure 6:
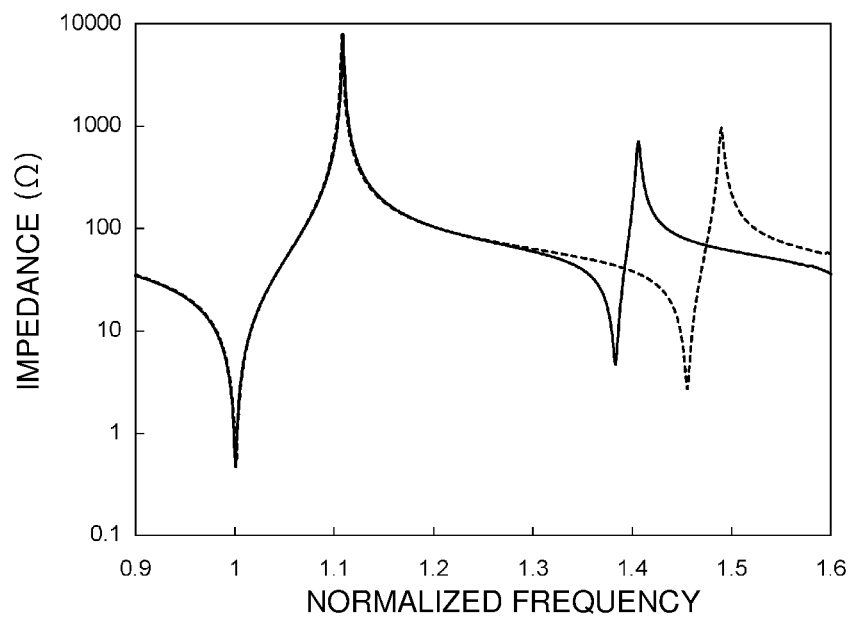
FIG. 6 illustrates the impedance characteristics of an elastic wave device of a first experimental example according to the first preferred embodiment of the present invention and the elastic wave device of the first comparative example.

FIG. 6 illustrates the impedance characteristics of the elastic wave device according to the first experimental example of the first preferred embodiment and the elastic wave device according to the first comparative example. As in FIG. 3, the horizontal axis in FIG. 6 indicates a normalized frequency, which is obtained by normalizing frequency to the resonant frequency of the fundamental mode of each elastic wave device, with respect to the impedance characteristics of the elastic wave devices according to the first experimental example and the first comparative example. The resonant frequency of the fundamental mode in the first experimental example is actually lower than that in the first comparative example by about 1%. In FIG. 6, however, the fundamental-mode resonant frequencies in the first experimental example and the first comparative example are illustrated so as to be matched to each other. A solid line indicates the results of the first experimental example, and a broken line indicates the results of the first comparative example.

As illustrated in FIG. 6, the fundamental mode in the first experimental example of the first preferred embodiment conforms closely to that in the first comparative example. The resonant frequency of a spurious response in the first experimental example is closer to the resonant frequency of the fundamental mode than the resonant frequency of a spurious response in the first comparative example. Specifically, the resonant frequency ratio $F_s/F_m$ of the resonant frequency $F_s$ of the spurious response to the resonant frequency $F_m$ of the fundamental mode is about 1.454 in the first comparative example. In contrast, in the first experimental example, the resonant frequency ratio $F_s/F_m$ is about 1.384, which indicates that the resonant frequency ratio $F_s/F_m$ is preferably outside the range of about 1.45 to about 1.55. Thus, in the first preferred embodiment, the spurious response frequency is distant from frequency bands used for other communication systems. Accordingly, the influence of the spurious response on other communication systems is sufficiently reduced or prevented.

The resonant frequency ratios $F_s/F_m$ at different film thicknesses of the low acoustic impedance layer closest to the piezoelectric layer were determined.

Figure 7:
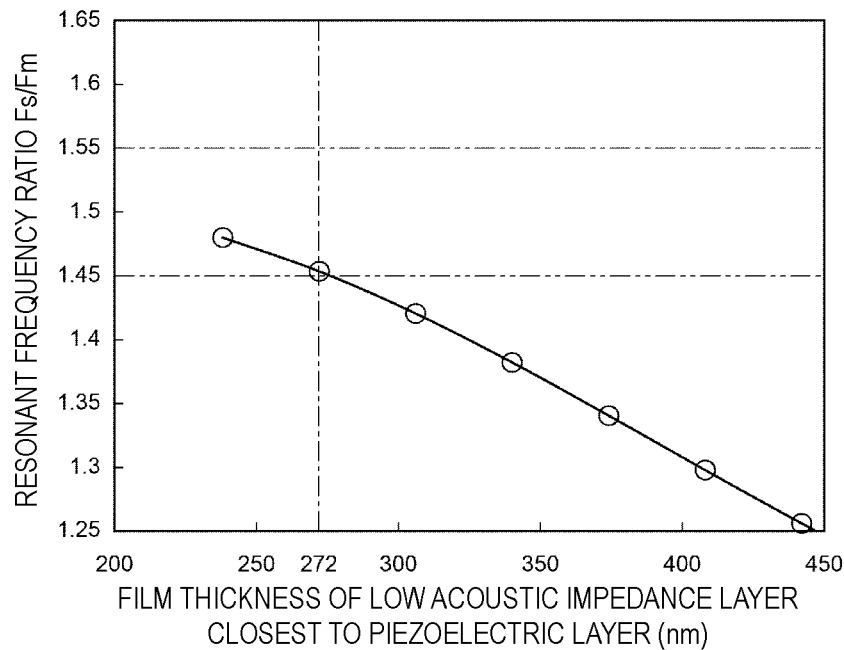
FIG. 7 illustrates the relationship between the film thickness of a low acoustic impedance layer closest to the piezoelectric layer and the resonant frequency ratio $F_s/F_m$.

FIG. 7 illustrates the relationship between the film thickness of the low acoustic impedance layer closest to the piezoelectric layer and the resonant frequency ratio $F_s/F_m$.

FIG. 7 indicates that a larger film thickness of the low acoustic impedance layer closest to the piezoelectric layer results in a lower resonant frequency ratio $F_s/F_m$. A dash-dotted line in FIG. 7 indicates the film thickness of the low acoustic impedance layers except the low acoustic impedance layer closest to the piezoelectric layer. When this film thickness is smaller than the film thickness of the low acoustic impedance layer closest to the piezoelectric layer, the resonant frequency ratio $F_s/F_m$ is outside the range of about 1.45 to about 1.55.

Here, the impedance characteristics of the elastic wave device 1 according to a second experimental example of the first preferred embodiment are illustrated, the elastic wave device 1 including the low acoustic impedance layer 4a closest to the piezoelectric layer 6, the low acoustic impedance layer 4a preferably having a film thickness of about 408 nm, for example. The specifications of the elastic wave device 1 according to the second experimental example are described below.

Piezoelectric layer 6: material: $LiNbO_3$, film thickness: about 340 nm, Euler angles: about (90°, 90°, 40°)

Interdigital transducer electrode 7: material: Al, film thickness: about 85 nm, duty ratio: about 0.5

Wavelength $\lambda_x$ of elastic wave in propagation direction, defined by electrode finger pitch of interdigital transducer electrode 7: about 1.7 μm Low acoustic impedance layers 4a to 4d: material: $SiO_2$, number of layers: 4

Film thickness of low acoustic impedance layer 4a: about 408 nm

Film thickness of each of low acoustic impedance layers 4b to 4d: about 272 nm

High acoustic impedance layers 5a to 5c: material: Pt, number of layers: 3

Film thickness of each of high acoustic impedance layers 5a to 5c: about 105 nm

Supporting substrate 2: material: Si

Figure 8:
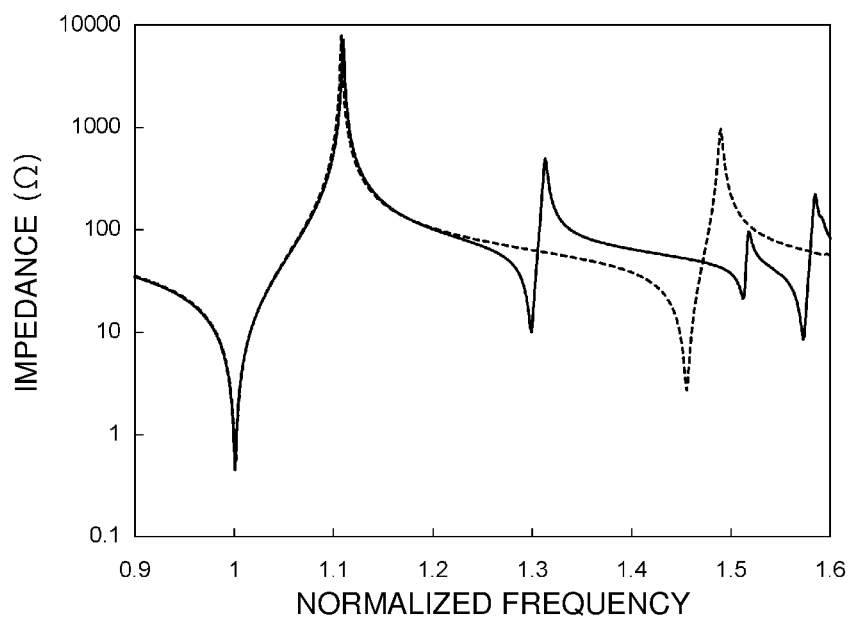
FIG. 8 illustrates the impedance characteristics of an elastic wave device of a second experimental example according to the first preferred embodiment of the present invention and the elastic wave device of the first comparative example.

FIG. 8 illustrates the impedance characteristics of the elastic wave devices according to the second experimental example of the first preferred embodiment and the first comparative example. As with FIG. 3, the horizontal axis in FIG. 8 indicates a normalized frequency, which is obtained by normalizing frequency to the resonant frequency of the fundamental mode of each elastic wave device, with respect to the impedance characteristics of the elastic wave devices according to the second experimental example and the first comparative example. The resonant frequency of the fundamental mode in the second experimental example is actually lower than that in the first comparative example by about 1%. In FIG. 8, however, the fundamental-mode resonant frequencies in the second experimental example and the first comparative example are illustrated so as to be matched to each other. A solid line indicates the results of the second experimental example, and a broken line indicates the results of the first comparative example.

FIG. 8 indicates that in the second experimental example, a spurious response due to an $SH_1$-mode plate wave occurs at a lower frequency than the first experimental example illustrated in FIG. 6. In the $SH_1$-mode spurious response, the resonant frequency ratio $F_s/F_m$ is about 1.298. As described above, also in the second experimental example, the frequency at which the largest $SH_1$-mode spurious response occurs is distant from frequency bands used for other communication systems. In the second experimental example, a spurious response due to an $A_1$-mode plate wave occurs at a normalized frequency of about 1.5. Also in the case of the $A_1$-mode spurious response, the resonant frequency ratio $F_s/F_m$ is preferably outside the range of about 1.45 to about 1.55.

In the second experimental example, the film thickness of the low acoustic impedance layer 4a closest to the piezoelectric layer 6 is larger than that in the first experimental example. Thus, the $A_1$-mode spurious response occurs at a lower frequency than that in the first experimental example. Accordingly, the upper limit of the film thickness of the low acoustic impedance layer 4a is preferably set. Here, the resonant frequency ratios $F_s/F_m$ in the $A_1$-mode spurious response were determined at different film thicknesses of the low acoustic impedance layer 4a.

Figure 9:
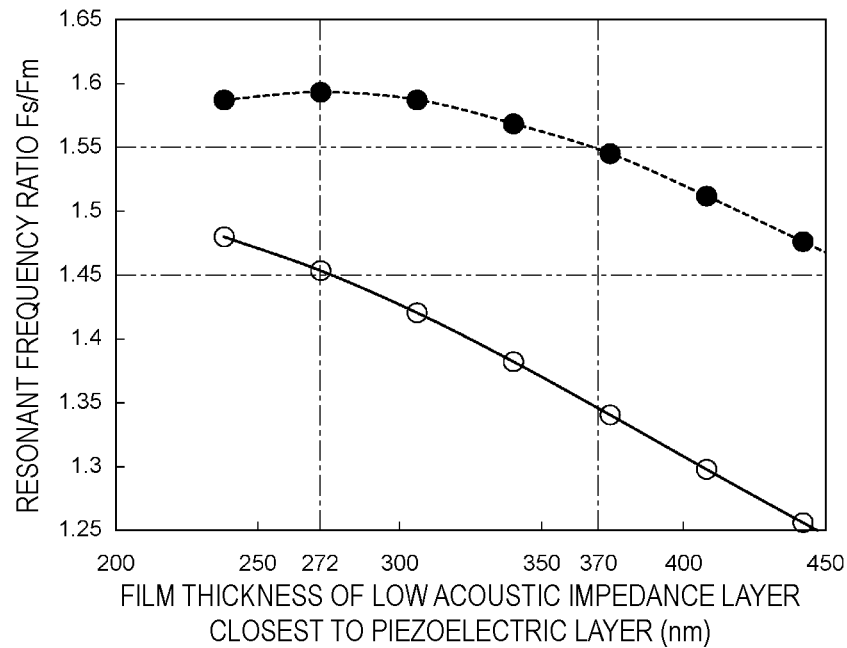
FIG. 9 illustrates the relationship between the film thickness of the low acoustic impedance layer closest to the piezoelectric layer and the resonant frequency ratio $F_s/F_m$.

FIG. 9 illustrates the relationship between the film thickness of the low acoustic impedance layer closest to the piezoelectric layer and the resonant frequency ratio $F_s/F_m$. In FIG. 9, white circles and a solid line indicate the results in the $SH_1$-mode spurious response, similar to FIG. 7. Black circles and a broken line indicate the results in $A_1$-mode spurious response.

As illustrated in FIG. 9, regarding the $A_1$-mode spurious response, when the film thickness of the low acoustic impedance layer closest to the piezoelectric layer is about 370 nm, for example, which is less than about 1.38 times the film thickness of the other low acoustic impedance layers, the resonant frequency ratio $F_s/F_m$ is outside the range of about 1.45 to about 1.55. Accordingly, the film thickness of the low acoustic impedance layer closest to the piezoelectric layer is preferably, for example, less than about 1.38 times the film thickness of the other low acoustic impedance layers. In this case, regarding the $A_1$-mode spurious response, the resonant frequency ratio $F_s/F_m$ is outside the range of about 1.45 to about 1.55. This further reduces or prevents the influence of the spurious response on other communication systems.

As described above, the spurious modes in the first experimental example and the second experimental example of the first preferred embodiment are the $SH_1$ mode and the $A_1$ mode. In these modes each having a node in the thickness direction of the piezoelectric layer 6 and a large change in displacement, the characteristic values, such as frequency, are easily changed by changing the film thickness of a layer in which the energy of a wave is present, compared with, for example, the $S_0$ mode having a small change in displacement in the thickness direction. Typically, the $S_0$ mode has the highest frequency among plate-wave modes each having no node in the thickness direction of the piezoelectric layer 6 and a small change in displacement in the thickness direction. Thus, in the case of using the $S_0$ mode as a fundamental mode, many modes causing spurious responses in high frequencies have nodes in the thickness direction of the piezoelectric layer 6, such as the $SH_1$ mode and the $A_1$ mode, for example. Accordingly, the relationship between the fundamental mode and the spurious mode in terms of frequency is able to be controlled by changing the film thickness of the low acoustic impedance layer 4a closest in the acoustic reflection layer 3 to the piezoelectric layer 6.

Which mode is excited to allow a spurious response to occur depends on conditions, such as the type and the orientation of the piezoelectric layer 6, for example. Thus, a mode other than the $SH_1$ mode or the $A_1$ mode causes the spurious response, in some cases. Even in such a case, if the $S_0$ mode is used as a fundamental mode, the mode causing the spurious response has a large change in displacement in the thickness direction and a large change in frequency with respect to a change in the film thickness of a layer in which the energy of a wave is present. Thus, preferred embodiments of the present invention may be suitably applied.

The foregoing advantageous effect is able to be obtained by changing the film thickness of the piezoelectric layer 6. In this case, however, the characteristics, such as an electromechanical coupling coefficient, in the fundamental mode are markedly changed. Furthermore, the advantageous effect may also be obtained by changing the film thicknesses of all of the low acoustic impedance layers and the high acoustic impedance layers in the acoustic reflection layer 3. In this case, however, the dependence of the reflection characteristics of the entire acoustic reflection layer 3 on frequency may be markedly changed to increase the insertion loss. In contrast, in the first preferred embodiment, the film thickness of only the low acoustic impedance layer 4a closest to the piezoelectric layer 6 is larger than those of the other low acoustic impedance layers. Thus, the relationship between the fundamental mode and the spurious mode in terms of frequency is able to be controlled without significantly affecting the characteristics of the fundamental mode or degrading the reflection characteristics of the acoustic reflection layer 3.

Even in the case in which the film thickness of the low acoustic impedance layer 4a closest to the piezoelectric layer is smaller than that of the low acoustic impedance layer 4b closest, among the remaining low acoustic impedance layers, to the low acoustic impedance layer 4a, the relationship between the fundamental mode and the spurious mode in terms of frequency are able to be controlled without significantly affecting the characteristics of the fundamental mode or degrading the reflection characteristics of the acoustic reflection layer 3, compared with the related art. The term "related art" used here refers to a structure in which the low acoustic impedance layers have the same or substantially the same film thickness.

The fact that the frequency-temperature characteristics are effectively improved in the first preferred embodiment will be described below.

Conditions other than the film thickness of the low acoustic impedance layer closest to the piezoelectric layer were the same or substantially the same as those in the first experimental example. The temperature coefficients of resonant frequency (TCF) were determined at different film thicknesses of the low acoustic impedance layer closest to the piezoelectric layer.

Figure 10:
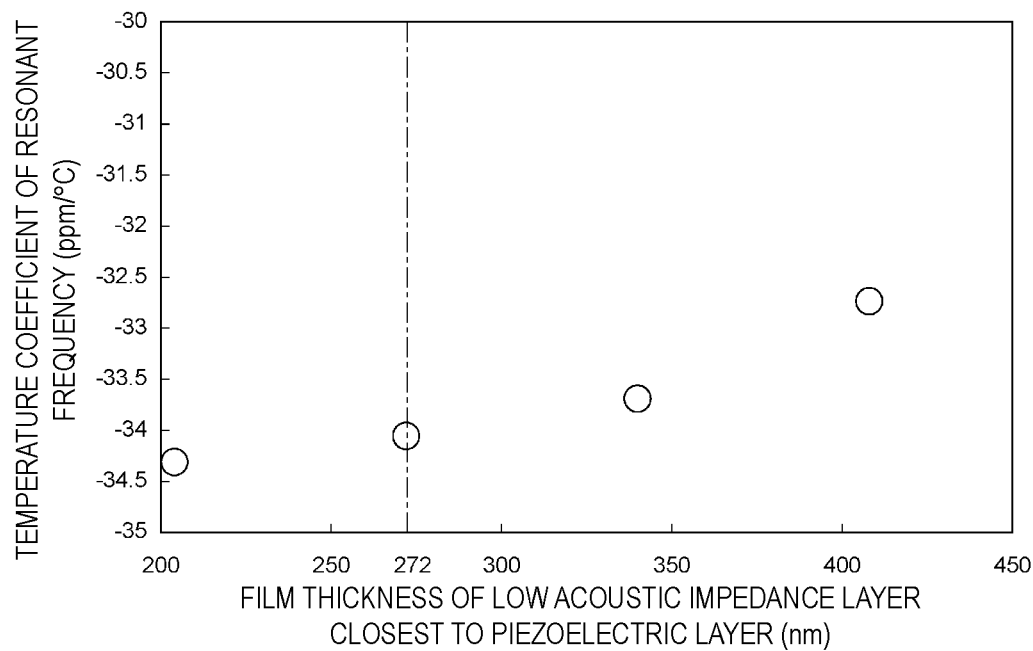
FIG. 10 illustrates the relationship between the film thickness of the low acoustic impedance layer closest to the piezoelectric layer and the temperature coefficient of resonant frequency TCF.

FIG. 10 illustrates the relationship between the film thickness of the low acoustic impedance layer closest to the piezoelectric layer and the temperature coefficient of resonant frequency (TCF).

FIG. 10 indicates that a larger film thickness of the low acoustic impedance layer closest to the piezoelectric layer results in a lower absolute value of the temperature coefficient of resonant frequency (TCF). As described above, in the first comparative example, the film thickness of the low acoustic impedance layer closest to the piezoelectric layer is equal or approximately equal to the film thickness of the other low acoustic impedance layers. When the film thickness of the low acoustic impedance layer closest to the piezoelectric layer is larger than that of the low acoustic impedance layer closest to the piezoelectric layer according to the first comparative example, which is indicated by a dash-dotted line, the absolute value of the temperature coefficient of resonant frequency (TCF) is small. Thus, in the first preferred embodiment, the frequency-temperature characteristics are effectively improved.

While the $S_0$-mode plate wave is used as a fundamental mode in the first preferred embodiment, the same or substantially the same advantageous effects are able to be provided even when a plate wave in a different mode is used as a fundamental mode.

An elastic wave device according to a second preferred embodiment of the present invention will be described below. The same reference numerals as those in the first preferred embodiment are used. In the present preferred embodiment, the film thickness of the low acoustic impedance layer 4a closest to the piezoelectric layer 6 is different from that in the first preferred embodiment. The elastic wave device 1 according to the second preferred embodiment has the same or substantially the same structure as the elastic wave device 1 according to the first preferred embodiment, except for the above-described structure.

Also in the present preferred embodiment, the film thickness of the low acoustic impedance layer 4a closest to the piezoelectric layer 6 is larger than those of the other low acoustic impedance layers. Thus, as with the first preferred embodiment, the resonant frequency of a spurious response is closer to the resonant frequency of the fundamental mode, and a spurious response frequency is distant from frequency bands used for other communication systems.

In the present preferred embodiment, the film thickness of the low acoustic impedance layer 4a closest to the piezoelectric layer 6 is preferably, for example, about ¾ of a component of the wavelength of a transversal elastic wave, propagating through the low acoustic impedance layer 4a, in the thickness direction of the piezoelectric layer 6. The film thickness of the low acoustic impedance layers except the low acoustic impedance layer 4a and the film thickness of all of the high acoustic impedance layers are preferably, for example, about ¼ of a component of the wavelength of the transversal elastic wave, propagating through the layers, in the thickness direction of the piezoelectric layer 6. This further improves the frequency-temperature characteristics without degrading the reflection characteristics of the acoustic reflection layer 3.

When the film thickness of the low acoustic impedance layer 4a closest to the piezoelectric layer 6 is in the range of about 0.7 times to about 0.8 times, for example, the component of the wavelength of the transversal elastic wave, propagating through the low acoustic impedance layer 4a, in the thickness direction of the piezoelectric layer 6, the foregoing advantageous effects are provided. Similarly, when the film thickness of the low acoustic impedance layers except the low acoustic impedance layer 4a and the film thickness of all of the high acoustic impedance layers are in the range of about 0.2 times to about 0.3 times, for example, the component of the wavelength of the transversal elastic wave, propagating through the layers, in the thickness direction of the piezoelectric layer 6, the advantageous effects are provided.

Specifically, the wavelength of the transversal elastic wave that defines the film thicknesses of the low acoustic impedance layers and the high acoustic impedance layers is a wavelength at or approximately at the center frequency of the transversal elastic wave. The effect of further improving the frequency-temperature characteristics without degrading the reflection characteristics of the acoustic reflection layer 3 will be described below.

Figure 11:
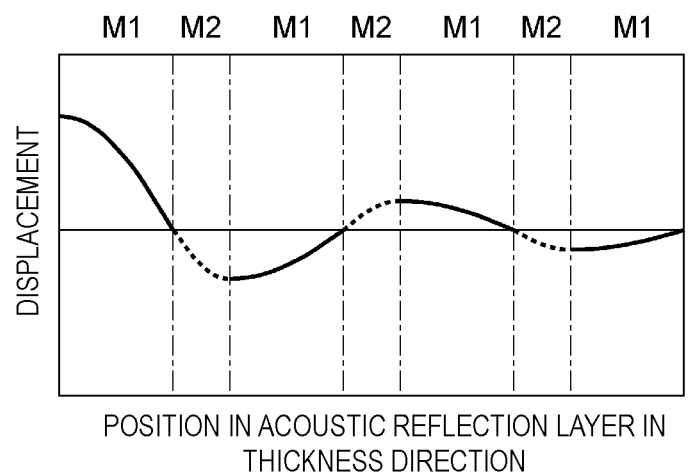
FIG. 11 illustrates an example of the displacement of an elastic wave propagating through an acoustic reflection layer.

FIG. 11 illustrates an example of the displacement of an elastic wave propagating through the acoustic reflection layer. In FIG. 11, each M1 indicates a low acoustic impedance layer, and each M2 indicates a high acoustic impedance layer. The left side of FIG. 11 is adjacent to the piezoelectric layer, and the right side is adjacent to the supporting substrate. Solid lines indicate the displacement in the low acoustic impedance layers. Broken lines indicate the displacement in the high acoustic impedance layers. The same is true in FIG. 13.

Usually, the film thickness of each layers included in the acoustic reflection layer is preferably designed to be, for example, about ¼ times the component of the wavelength of the transversal elastic wave, propagating through each layer included in the acoustic reflection layer, in the thickness direction of the piezoelectric layer. In this case, as illustrated in FIG. 11, waves propagating in a direction away from the piezoelectric layer weaken each other. Waves propagating toward the piezoelectric layer strengthen each other. Thus, the elastic wave is confined to the piezoelectric layer side.

When the transversal elastic wave propagates through different media, the transversal elastic wave has different velocities and different wavelengths in the different media. Thus, in FIG. 11, the film thickness of the low acoustic impedance layers is different from that of the high acoustic impedance layers.

Figure 12:
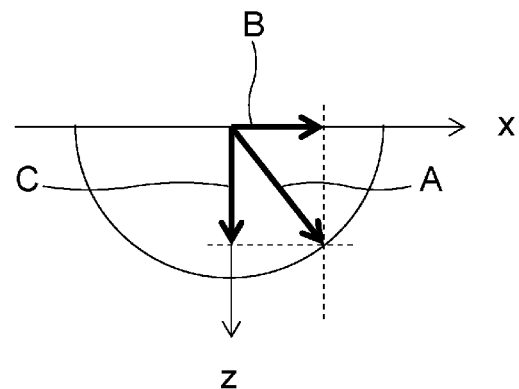
FIG. 12 is a schematic view illustrating components of a bulk wave when an elastic wave excited by an interdigital transducer electrode disposed on a piezoelectric layer propagates as the bulk wave toward a substrate.

FIG. 12 is a schematic view illustrating components of a bulk wave when an elastic wave excited by an interdigital transducer electrode disposed on a piezoelectric layer propagates as the bulk wave toward a substrate. In FIG. 12, x- and z-directions correspond to the x- and z-directions, respectively, in FIG. 1B.

Here, the elastic wave that is excited by the interdigital transducer electrode and that propagates as the bulk wave toward the substrate is expressed by a wave vector having a magnitude determined by the acoustic velocity and the frequency of the bulk wave. An example of the wave vector is indicated by wave vector A in FIG. 12. Because of excitation by the interdigital transducer electrode, the bulk wave includes wave component B in the x direction parallel or substantially parallel to a main surface of the substrate. The magnitude of the wave component B is determined by a wavelength defined by the electrode finger pitch of the interdigital transducer electrode. Wave component C in the thickness direction z of the piezoelectric layer is determined according to FIG. 12, and then the component of the wavelength in the thickness direction z of the piezoelectric layer is determined.

Denoting the wavelength, defined by the electrode finger pitch of the interdigital transducer electrode, of the elastic wave in the propagation direction as $\lambda_x$, denoting the frequency as f, denoting the propagation velocity of the transversal bulk wave propagating through a medium as v, and denoting the component of the wavelength of the transversal bulk wave, propagating through the medium, in the thickness direction of the piezoelectric layer as $\lambda_z$, $\lambda_z$ is represented by the following expression, provided that the medium is an isotropic body:

$$\lambda_z = \left( \sqrt{\frac{f^2}{v^2} - \frac{1}{\lambda_x^2}} \right)^{-1} \quad (1)$$

The bulk wave that is excited by applying an alternating voltage to the interdigital transducer electrode and that radiates in the thickness direction of the piezoelectric layer includes a longitudinal-wave component and a transversal-wave component. The transversal wave is separated into a shear horizontal (SH) wave including a displacement component parallel or substantially parallel to a boundary surface between the piezoelectric layer and a layer stacked on the piezoelectric layer and a shear vertical (SV) wave including a displacement component perpendicular or substantially perpendicular to the foregoing displacement component. The SH wave is reflected from or transmitted through the boundary surface without mode conversion. In contrast, when the SV wave and the longitudinal wave are reflected from or transmitted through the boundary surface, mode conversion occurs between the SV wave and the longitudinal wave. The longitudinal wave and the transversal wave have different acoustic velocities and thus have different wavelengths. Thus, the film thickness of each layer in the acoustic reflection layer that efficiently reflects the longitudinal wave is different from the film thickness of each layer in the acoustic reflection layer that efficiently reflects the transversal wave. However, because the mode conversion occurs between the longitudinal wave and the SV wave, in the case in which the film thickness is designed to correspond to the wavelength of the transversal wave, a component that is incident on the acoustic reflection layer in the form of a longitudinal wave may also be reflected. Thus, as described above, the film thickness of each layer in the acoustic reflection layer is preferably designed to be, for example, about ¼ times the wavelength of the transversal elastic wave, propagating through each layer included in the acoustic reflection layer, in the thickness direction of the piezoelectric layer, so that the elastic wave is confined to the piezoelectric layer side. However, when the film thickness of all of the layers in the acoustic reflection layer is about ¼ times the component of the wavelength, the frequency-temperature characteristics cannot be sufficiently improved.

Figure 13:
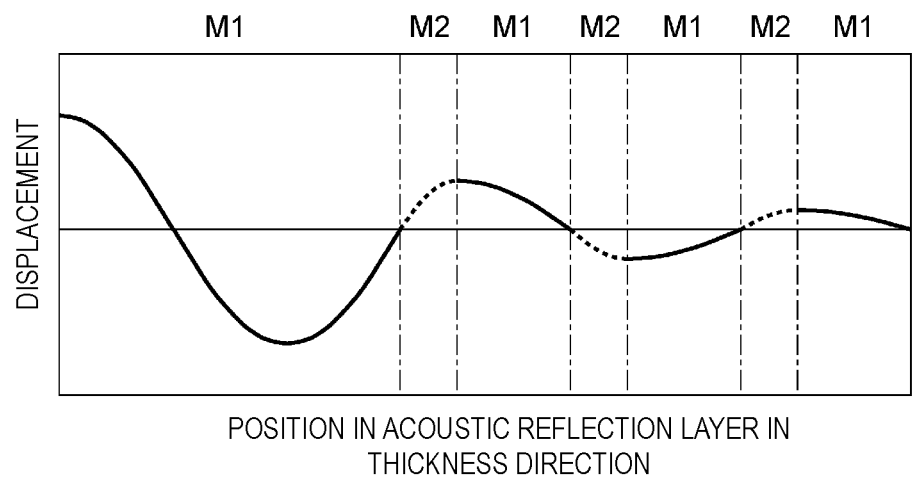
FIG. 13 illustrates an example of the displacement of an elastic wave propagating through an acoustic reflection layer when the relationship between low acoustic impedance layers in terms of film thickness is the same or substantially the same as that in a second preferred embodiment of the present invention.

FIG. 13 illustrates an example of the displacement of the elastic wave propagating through the acoustic reflection layer when the relationship between the low acoustic impedance layers in terms of film thickness is the same or substantially the same as that in the second preferred embodiment.

In the present preferred embodiment, the film thickness of the low acoustic impedance layer 4a closest to the piezoelectric layer 6 is preferably, for example, about ¾ times the component of the wavelength of the transversal elastic wave, propagating through the low acoustic impedance layer 4a, in the thickness direction of the piezoelectric layer 6. Thus, as illustrated in FIG. 13, the percentage of the energy of the elastic wave present in the low acoustic impedance layer 4a is increased while the relationship in which the elastic waves strengthen and weaken each other is not changed from the relationship illustrated in FIG. 11. Accordingly, the frequency-temperature characteristics are further improved without degrading the reflection characteristics of the acoustic reflection layer 3.

The elastic wave device according to each of the foregoing preferred embodiments may be used for, for example, a duplexer of a high-frequency front-end circuit. The present preferred embodiment will be described below.

Figure 14:
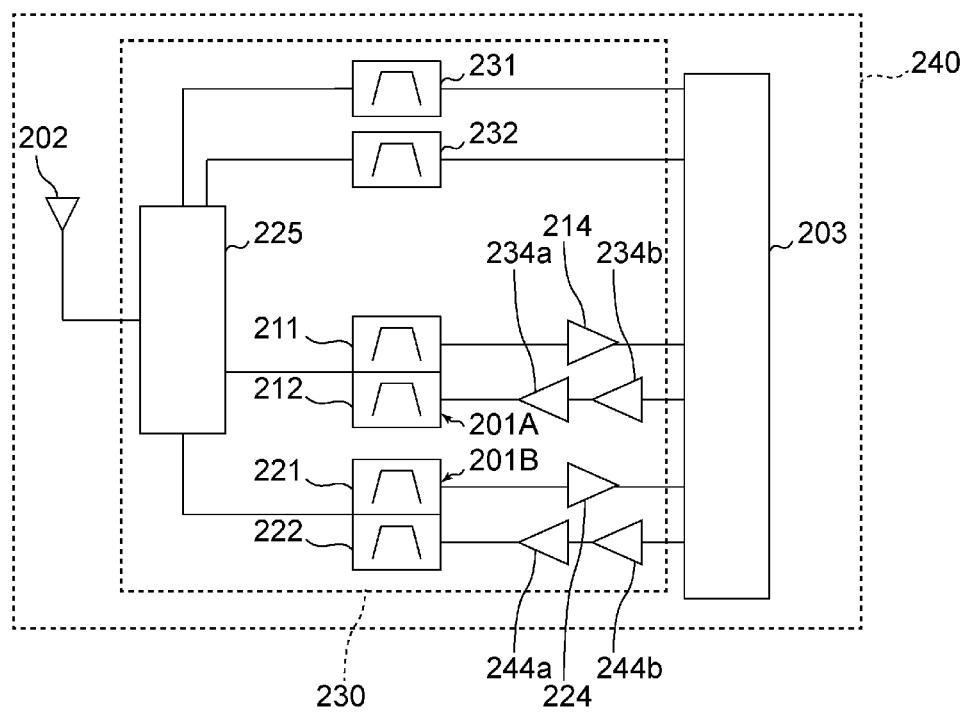
FIG. 14 is a schematic diagram of a communication apparatus including a high-frequency front-end circuit.

FIG. 14 is a schematic diagram of a high-frequency front-end circuit and a communication apparatus according to a preferred embodiment of the present invention. FIG. 14 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 14 are examples of the high-frequency front-end circuit and the communication apparatus according to a preferred embodiment of the present invention. The high-frequency front-end circuit and the communication apparatus are not limited to the configuration shown in FIG. 14.

The duplexer 201A includes filters 211 and 212. The duplexer 201B includes filters 221 and 222. The duplexers 201A and 201B are connected to the antenna element 202 via the switch 225. Elastic wave devices according to preferred embodiments of the present invention may be used for the duplexers 201A and 201B or may be used for the filters 211, 212, 221, and 222.

The elastic wave devices according to preferred embodiments of the present invention may be used for multiplexers each including three or more filters, for example, triplexers each including three filters that share a common antenna terminal and hexaplexers including six filters that share a common antenna terminal.

Examples of the elastic wave device according to preferred embodiments of the present invention include elastic wave resonators, filters, duplexers, and multiplexers each including about three or more filters. The configuration of each of the multiplexers is not limited to a configuration including both a transmitting filter and a receiving filter. Each multiplexer may include only a transmitting filter or only a receiving filter.

The switch 225 connects the antenna element 202 to at least one signal path corresponding to a predetermined band in response to a control signal from a controller (not illustrated), and may preferably include, for example, a single-pole double-throw (SPDT) switch. The at least one signal path connected to the antenna element 202 may preferably include a plurality of signal paths. That is, the high-frequency front-end circuit 230 may support carrier aggregation.

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing, such as down-conversion, for example, and feeds a reception signal generated by the signal processing. The RF signal integrated circuit 203 allows a transmission signal fed thereto to be subjected to signal processing, such as up-conversion, for example, and feeds a high-frequency transmission signal generated by the signal processing to the power amplifier circuits 234a, 234b, 244a, and 244b. The RF signal integrated circuit 203 is preferably, for example, an RFIC. The communication apparatus may include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are, for example, an image signal and an audio signal.

The high-frequency front-end circuit 230 may include duplexers according to a modification of the duplexers 201A and 201B, in place of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

In the high-frequency front-end circuit 230 and the communication apparatus 240 having the configuration described above, the use of elastic wave devices according to preferred embodiments of the present invention as an elastic wave resonator, a filter, a duplexer, a multiplexer including about three or more filters, or other suitable device enables a spurious response frequency to be distant from frequency bands used for other communication systems and effectively improves the frequency-temperature characteristics.

The elastic wave devices, the high-frequency front-end circuits, and the communication apparatuses according to preferred embodiments of the present invention have been described. The present invention include other preferred embodiments provided by combinations of the elements in the preferred embodiments described above, modifications obtained by various modifications of the above-described preferred embodiments conceived by those skilled in the art without departing from the gist of the present invention, and various devices including the high-frequency front-end circuits and the communication apparatuses according to preferred embodiments of the present invention.

Preferred embodiments of the present invention may be widely used in communication devices, such as cellular phones, as elastic wave resonators, filters, duplexers, multiplexers that may be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a supporting substrate;
   an acoustic reflection layer disposed on the supporting substrate;
   a piezoelectric layer disposed on the acoustic reflection layer; and
   an interdigital transducer electrode disposed on the piezoelectric layer; wherein the acoustic reflection layer includes:
  three or more low acoustic impedance layers; and
  two or more high acoustic impedance layers;
a film thickness of a low acoustic impedance layer of the three or more low acoustic impedance layers closest to the piezoelectric layer is larger than a film thickness of a low acoustic impedance layer of the three or more low acoustic impedance layers closest to the low acoustic impedance layer that is closest to the piezoelectric layer; and
the film thickness of the low acoustic impedance layer closest to the piezoelectric layer is about 1.38 times or less than the film thickness of the low acoustic impedance layer closest to the low acoustic impedance layer that is closest to the piezoelectric layer.

2. An elastic wave device comprising:
a supporting substrate;
an acoustic reflection layer disposed on the supporting substrate;
a piezoelectric layer disposed on the acoustic reflection layer with no conductor layer disposed therebetween; and
an interdigital transducer electrode disposed on the piezoelectric layer; wherein
the acoustic reflection layer includes:
  three or more low acoustic impedance layers; and
  two or more high acoustic impedance layers; and
a film thickness of a low acoustic impedance layer of the three or more low acoustic impedance layers closest to the piezoelectric layer is larger than a film thickness of a low acoustic impedance layer of the three or more low acoustic impedance layers closest to the low acoustic impedance layer that is closest to the piezoelectric layer.

3. The elastic wave device according to claim 2, wherein the three or more low acoustic impedance layers and the two or more high acoustic impedance layers are alternately stacked.

4. The elastic wave device according to claim 2, wherein the film thickness of the low acoustic impedance layer closest to the piezoelectric layer is in a range of about 0.7 times to about 0.8 times a component of a wavelength of a transversal elastic wave in a thickness direction of the piezoelectric layer, the transversal elastic wave propagating through the low acoustic impedance layer closest to the piezoelectric layer.

5. The elastic wave device according to claim 4, wherein
a film thickness of each of the three or more low acoustic impedance layers except the low acoustic impedance layer closest to the piezoelectric layer is in a range of about 0.2 times to about 0.3 times the component of the wavelength of the transversal elastic wave in the thickness direction of the piezoelectric layer, the transversal elastic wave propagating through the low acoustic impedance layers; and
a film thickness of each of the two or more high acoustic impedance layers is in a range of about 0.2 times to about 0.3 times the component of the wavelength of the transversal elastic wave in the thickness direction of the piezoelectric layer, the transversal elastic wave propagating through the high acoustic impedance layers.

6. The elastic wave device according to claim 2, wherein the elastic wave device is structured to generate an $S_0$-mode plate wave.

7. The elastic wave device according to claim 2, wherein a spurious response of a mode different from a fundamental mode used occurs; and
denoting a resonant frequency of the spurious response as $F_s$, denoting a resonant frequency of the fundamental mode as $F_m$, and denoting a resonant frequency ratio of the spurious response to the fundamental mode as $F_s/F_m$, the resonant frequency ratio $F_s/F_m$ is outside a range of about 1.45 to about 1.55.

8. The elastic wave device according to claim 2, wherein each of the low acoustic impedance layers is made of silicon oxide.

9. A high-frequency front-end circuit comprising:
the elastic wave device according to claim 2; and
a power amplifier.

10. The high-frequency front-end circuit according to claim 9, wherein the three or more low acoustic impedance layers and the two or more high acoustic impedance layers are alternately stacked.

11. The high-frequency front-end circuit according to claim 9, wherein the film thickness of the low acoustic impedance layer closest to the piezoelectric layer is about 1.38 times or less the film thickness of the low acoustic impedance layer closest to the low acoustic impedance layer that is closest to the piezoelectric layer.

12. The high-frequency front-end circuit according to claim 9, wherein the film thickness of the low acoustic impedance layer closest to the piezoelectric layer is in a range of about 0.7 times to about 0.8 times a component of a wavelength of a transversal elastic wave in a thickness direction of the piezoelectric layer, the transversal elastic wave propagating through the low acoustic impedance layer closest to the piezoelectric layer.

13. The high-frequency front-end circuit according to claim 12, wherein
a film thickness of each of the three or more low acoustic impedance layers except the low acoustic impedance layer closest to the piezoelectric layer is in a range of about 0.2 times to about 0.3 times the component of the wavelength of the transversal elastic wave in the thickness direction of the piezoelectric layer, the transversal elastic wave propagating through the low acoustic impedance layers; and
a film thickness of each of the two or more high acoustic impedance layers is in a range of about 0.2 times to about 0.3 times the component of the wavelength of the transversal elastic wave in the thickness direction of the piezoelectric layer, the transversal elastic wave propagating through the high acoustic impedance layers.

14. The high-frequency front-end circuit according to claim 9, wherein the elastic wave device is structured to generate an $S_0$-mode plate wave.

15. The high-frequency front-end circuit according to claim 9, wherein
a spurious response of a mode different from a fundamental mode used occurs; and
denoting a resonant frequency of the spurious response as $F_s$, denoting a resonant frequency of the fundamental mode as $F_m$, and denoting a resonant frequency ratio of the spurious response to the fundamental mode as $F_s/F_m$, the resonant frequency ratio $F_s/F_m$ is outside a range of about 1.45 to about 1.55.

16. The high-frequency front-end circuit according to claim 9, wherein each of the low acoustic impedance layers is made of silicon oxide.

17. A communication apparatus comprising:
the high-frequency front-end circuit according to claim 9; and
an RF signal processing circuit.

18. The communication apparatus according to claim 17, wherein the three or more low acoustic impedance layers and the two or more high acoustic impedance layers are alternately stacked.

19. The communication apparatus according to claim 17, wherein the film thickness of the low acoustic impedance layer closest to the piezoelectric layer is about 1.38 times or less the film thickness of the low acoustic impedance layer closest to the low acoustic impedance layer that is closest to the piezoelectric layer.

20. The communication apparatus according to claim 17, wherein the film thickness of the low acoustic impedance layer closest to the piezoelectric layer is in a range of about 0.7 times to about 0.8 times a component of a wavelength of a transversal elastic wave in a thickness direction of the piezoelectric layer, the transversal elastic wave propagating through the low acoustic impedance layer closest to the piezoelectric layer.

\* \* \* \* \*